United States Patent
Mattisson et al.

(10) Patent No.: US 9,413,301 B2
(45) Date of Patent: Aug. 9, 2016

(54) NOISE CANCELING LOW-NOISE AMPLIFIER

(71) Applicant: Telefonaktiebolaget L M Ericsson (publ), Stockholm (SE)

(72) Inventors: Sven Mattisson, Bjarred (SE); Stefan Andersson, Lund (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 0 days.

(21) Appl. No.: 14/375,131

(22) PCT Filed: Jan. 25, 2013

(86) PCT No.: PCT/EP2013/051504
§ 371 (c)(1),
(2) Date: Jul. 28, 2014

(87) PCT Pub. No.: WO2013/113637
PCT Pub. Date: Aug. 8, 2013

(65) Prior Publication Data
US 2015/0035602 A1     Feb. 5, 2015

Related U.S. Application Data

(60) Provisional application No. 61/595,456, filed on Feb. 6, 2012.

(30) Foreign Application Priority Data

Feb. 1, 2012  (EP) .................................... 12153471

(51) Int. Cl.
*H03F 1/26*     (2006.01)
*H03F 3/193*    (2006.01)
(Continued)

(52) U.S. Cl.
CPC .. *H03F 1/26* (2013.01); *H03F 1/56* (2013.01); *H03F 3/193* (2013.01); *H03F 3/211* (2013.01);
(Continued)

(58) Field of Classification Search
CPC ....... H03F 1/0288; H03F 1/07; H03F 1/3252; H03F 3/2178

USPC .................. 330/295, 124 R, 84, 126
See application file for complete search history.

(56) References Cited

U.S. PATENT DOCUMENTS 4,422,052 A * 12/1983 Yorkanis et al. .............. 330/295
4,689,578 A *  8/1987 Spychalski ....................... 330/2
(Continued)

FOREIGN PATENT DOCUMENTS

| EP | 1 635 453 A1 | 3/2006 |
|----|---|---|
| WO | 02/15397 A2 | 2/2002 |
| WO | 2006/083200 A1 | 8/2006 |

OTHER PUBLICATIONS

PCT International Search Report, mailed Jun. 26, 2013, in connection with International Application No. PCT/EP2013/051504, all pages.

(Continued)

*Primary Examiner* — Henry Choe
(74) *Attorney, Agent, or Firm* — Leffler Intellectual Property Law, PLLC

(57) ABSTRACT

A noise-canceling LNA circuit for amplifying signals at an operating frequency f in a receiver circuit is disclosed. The LNA circuit comprises a first and a second amplifier branch, each having an input terminal connected to an input terminal of the LNA circuit. The first amplifier branch comprises an output terminal for supplying an output current of the first amplifier branch and a common source or common emitter main amplifier. The main amplifier has an input transistor having a first terminal, which is a gate or base terminal, operatively connected to the input terminal of the first amplifier branch, a shunt-feedback capacitor operatively connected between the first terminal of the input transistor and a second terminal, which is a drain or collector terminal, of the input transistor, and an output capacitor operatively connected between the second terminal of the input transistor and the output terminal of the first amplifier branch. The second amplifier branch comprises an output terminal for supplying an output current of the second amplifier branch. The LNA circuit comprises circuitry for combining the output current of the first amplifier branch and the output current of the second amplifier branch, thereby generating a total output current of the LNA circuit.

14 Claims, 5 Drawing Sheets

(51) Int. Cl.
*H03F 1/56* (2006.01)
*H03F 3/21* (2006.01)

(52) U.S. Cl.
CPC ..... *H03F 2200/255* (2013.01); *H03F 2200/267* (2013.01); *H03F 2200/294* (2013.01); *H03F 2200/372* (2013.01); *H03F 2200/451* (2013.01)

(56) References Cited

U.S. PATENT DOCUMENTS

| | | | |
|---|---|---|---|
| 5,015,968 | A | 5/1991 | Podell et al. |
| 5,589,881 | A | 12/1996 | Dunham et al. |
| 5,963,094 | A | 10/1999 | Linder et al. |
| 6,147,559 | A | 11/2000 | Fong |
| 6,204,728 | B1 | 3/2001 | Hageraats |
| 6,211,738 | B1 | 4/2001 | Hecht |
| 7,202,733 | B1 | 4/2007 | Aram et al. |
| 7,466,205 | B1 | 12/2008 | Lin et al. |
| 7,843,269 | B2 * | 11/2010 | Chen et al. ............ 330/295 |
| 2005/0225397 | A1 | 10/2005 | Bhatia et al. |
| 2006/0035611 | A1 | 2/2006 | Connell et al. |
| 2008/0048785 | A1 | 2/2008 | Mokhtar et al. |
| 2008/0169877 | A1 | 7/2008 | Banba |
| 2008/0224779 | A1 | 9/2008 | Lin |
| 2008/0290944 | A1 | 11/2008 | Sarpeshkar et al. |
| 2009/0021295 | A1 | 1/2009 | Fu et al. |
| 2015/0002225 | A1 | 1/2015 | Mattisson et al. |

OTHER PUBLICATIONS

Bruccoleri, F. et al. "Noise cancelling in wideband CMOS LNAs" 2002 IEEE Solid-State Circuits Conference Digest of Technical Papers, Feb. 3-7, 2002, Piscataway, NJ, USA, Feb. 7, 2002, pp. 330, 331 and 533, XP032066685, ISBN: 978-0-7803-7335-8.

Bruccoleri, F. et al. "Noise cancelling in wideband CMOS LNAs" 2002 IEEE Solid-State Circuits Conference Digest of Technical Papers (Cat. No. 02CH37315), vol. 1, Jan. 1, 2002, pp. 406-407, XP055036202, ISBN: 978-0-78-037335-8.

Bruccoleri, F. et al. "Wide-Band CMOS Low-Noise Amplifier Exploiting Thermal Noise Canceling" IEEE Journal of Solid-State Circuits, IEEE Service Center, Piscataway, NJ, USA, vol. 39, No. 2, Feb. 1, 2004, pp. 275-282, XP011106496, ISSN: 0018-9200.

Chen, Wei-Hung et al. "A Highly Linear Broadband CMOS LNA Employing Noise and Distortion Cancellation" IEEE Journal of Solid-State Circuits, IEEE Service Center, Piscataway, NJ, USA, vol. 43, No. 5, May 1, 2008, pp. 1164-1176, XP011208016, ISSN: 0018-9200.

Liao, Chih-Fan et al. "A broadband noise-canceling CMOS LNA for 3.1-10.6-GHz UWB receiver" 2005 IEEE Custom Integrated Circuits Conference, IEEE, Piscataway, NE, USA, Sep. 18, 2005, pp. 160-163, XP010873768, ISBN: 978-0-7803-9023-2.

PCT International Search Report, mailed Oct. 31, 2013, in connection with International Application No. PCT/EP2013/051492, all pages.

PCT Written Opinion, mailed Oct. 31, 2013, in connection with International Application No. PCT/EP2013/051492, all pages.

Adabi, Ehsan et al. "CMOS Low Noise Amplifier with capacitive feedback matching" Proceedings IEEE 2007 Custom Integrated Circuits Conference, pp. 643-646.

Li, Qiang et al. "An Inductorless Low-Noise Amplifier with Noise Cancellation for UWB Receiver Front-End" IEEE 2006, pp. 267-270.

Im, Donggu et al. "A Low Power Broadband Differential Low Noise Amplifier Employing Noise and IM3 Distortion Cancellation for Mobile Broadcast Receivers" IEEE Microwave & Wireless Components Letters, vol. 20, No. 10, Oct. 2010, pp. 566-568.

E. M. Cherry, \Feedback, Sensitivity, and Stability of Audio Power Amplifiers, Journal of the Audio Engineering Society, vol. 30, pp. 282-294, May 1982, 13 pages.

Non-Final Office Action issued Aug. 31, 2015 in connection with U.S. Appl. No. 14/375,127, all pages.

* cited by examiner

NOISE CANCELING LOW-NOISE AMPLIFIER

CROSS-REFERENCE TO RELATED APPLICATIONS

This application claims priority under 35 U.S.C. §119 to European Patent Application No. 12153471.3, filed Feb. 1, 2012, which is hereby incorporated herein by reference in its entirety. This application also claims the benefit of U.S. Provisional Application No. 61/595,456, filed Feb. 6, 2012, which is hereby incorporated herein by reference in its entirety.

TECHNICAL FIELD

The present invention relates to the field of low-noise amplifiers for receivers, such as radio receivers.

BACKGROUND

When designing a low-noise amplifier (LNA) it is important to consider its required input matching (e.g. to 50Ω), matching bandwidth, noise figure, linearity and power consumption. If the LNA has a well behaved input impedance the matching network will be easy to design and robust in production. If the resistive component of the LNA's input impedance is very far from the desired matching impedance (e.g. 50Ω) it is very difficult to match it properly without adding extra resistive losses, and, hence, noise. Also a wide-band matching network will be more complex than a more narrow-band one. To keep cost and size down it is important that an LNA can be matched to several input frequencies. This requires wide band LNA structures. Finally, it is normally desirable to have a very high LNA input compression point without sacrificing power consumption.

Two common methods are used for setting the resistive part of the LNA input impedance: resistive shunt or inductive series degeneration. The inductive series feedback structure provides good noise properties but is inherently narrow band and is, thus, not suitable for wide-band matching or multi-band applications and will, typically, require an external matching component or network. The resistive shunt feedback has the advantage of providing an integrated wide-band input match but suffers from noise figure degradation due to the resistive feedback element and due to the fact that some of the drain/collector current, and its noise component, is fed back to the input via the shunt element.

To circumvent some of these shunt feedback noise issues an active wide-band input matching technique, in the following referred to as "resistive shunt feedback noise canceling", has been proposed by Bruccoleri et al (F. Bruccoleri, E. A. M. Klumperink, and B. Nauta, "Noise cancelling in Wideband CMOS LNAs," in IEEE International Solid-State Circuits Conference Digest of Technical Papers, 2002). This technique, illustrated in FIG. 1, exploits the fact that the drain noise of the impedance setting device, e.g. M1 in FIG. 1, is correlated and in-phase at the drain and gate terminals while the signal is anti-phase which leads to a cancellation opportunity.

SUMMARY

The inventors have realized that the above mentioned resistive shunt feedback noise canceling technique requires a relatively high voltage gain in the LNA to obtain a good noise figure. A high voltage gain, on the other hand, degrades the compression point due to clipping. Thus, the inventors have realized that there is a conflict between noise figure and linearity, which gives an inherent limitation of the resistive shunt feedback noise canceling technique. In light of this limitation, an object of the present invention is therefore to provide an improved low-noise amplifier utilizing noise canceling for use in a receiver circuit.

According to a first aspect, there is provided an LNA circuit for amplifying signals at an operating frequency f in a receiver circuit. The LNA circuit comprises a first and a second amplifier branch, each having an input terminal connected to an input terminal of the LNA circuit. The first amplifier branch comprises an output terminal for supplying an output current of the first amplifier branch. The first amplifier branch further comprises a common source or common emitter amplifier, in the following referred to as a main amplifier. The main amplifier has an input transistor having a first terminal, which is a gate or base terminal, operatively connected to the input terminal of the first amplifier branch. Furthermore, the main amplifier has a shunt-feedback capacitor operatively connected between the first terminal of the input transistor and a second terminal, which is a drain or collector terminal, of the input transistor. Moreover, the main amplifier has an output capacitor operatively connected between the second terminal of the input transistor and the output terminal of the first amplifier branch. The second amplifier branch comprises an output terminal for supplying an output current of the second amplifier branch. The LNA circuit comprises circuitry for combining the output current of the first amplifier branch and the output current of the second amplifier branch, thereby generating a total output current of the LNA circuit. With this structure, the drain noise of the input transistor of the main amplifier can be canceled in the total output current of the LNA circuit. This can be accomplished without the identified limitations associated with the resistive shunt-feedback noise-canceling technique.

The input transistor of the main amplifier may be arranged to, in operation, be biased to have a transconductance $g_m$ at the operating frequency f, and the output capacitor may have a capacitance value $C_L < g_m/f$.

The input transistor of the main amplifier may be a MOS transistor in common-source configuration, whereby the first terminal of said input transistor is a gate terminal, the second terminal of said input transistor is a drain terminal, and the main amplifier is a common source amplifier. The shunt-feedback capacitor may be or comprise a MOS gate capacitor implemented with a MOS transistor of the same type as the input transistor of the main amplifier. The feedback capacitor may be or comprise a gate-to-drain capacitance of the input transistor of the main amplifier of the first amplifier branch.

The input transistor of the main amplifier may be a bipolar junction transistor in common-emitter configuration, whereby the first terminal of said input transistor is a base terminal, and the second terminal of said input transistor is a collector terminal.

The second amplifier branch may comprise a transconductor arranged to generate the output current of the second amplifier branch.

The main amplifier may comprise a series inductor operatively connected between the first terminal of the input transistor and the input terminal of the main amplifier branch.

According to a second aspect, there is provided a receiver circuit. The receiver circuit comprises the LNA circuit according to the first aspect. Furthermore, the receiver circuit comprises a termination circuit with a current input terminal connected to the output terminal of the LNA circuit.

The termination circuit may e.g. be or comprise a common-base amplifier, a common-gate amplifier, a trans-impedance amplifier, a feedback-connected operational amplifier with a virtual-ground node as current input terminal, a transformer, or a current-mode mixer.

The receiver circuit may be a radio receiver circuit.

According to a third aspect, there is provided a radio communication apparatus comprising the receiver circuit according to the second aspect. The radio communication apparatus may e.g. be, but is not limited to, a mobile terminal, a wireless data modem, or a radio base station.

According to a fourth aspect, there is provided a wireline communication apparatus comprising the receiver circuit according to the second aspect. The wireline communication apparatus may e.g. be, but is not limited to, a cable modem.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 2:
FIG. 2 schematically illustrates a mobile terminal in communication with a radio base station.

FIG. 2 illustrates schematically an environment in which embodiments of the present invention may be employed. In FIG. 2, a mobile terminal 1, illustrated in FIG. 2 as a mobile, or cellular, telephone 1, is in wireless communication with a radio base station 2, e.g. in a cellular communication network. The mobile telephone 1 and the radio base station 2 are nonlimiting examples of what is referred to below generically with the term radio communication apparatus. Another nonlimiting example of such a radio communication apparatus is a wireless data modem, e.g. a wireless data modem to be used in a cellular communication network. Embodiments of the present invention may also be employed in radio communication apparatuses for operation in other types of communication networks, such as but not limited to wireless local area networks (WLANs) and personal area networks (PANs). Embodiments of the present invention may further also be employed in other types of communication apparatuses, e.g. wireline communication apparatuses, such as but not limited to cable modems.

Figure 3:
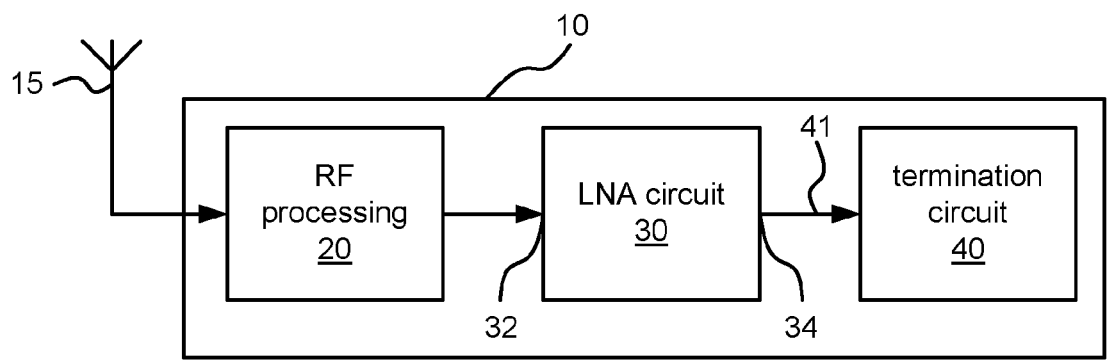
FIG. 3 shows a simplified block diagram of a radio receiver circuit according to some embodiments of the present invention.

Communication apparatuses may comprise one or more receiver circuits, such as a one or more radio receiver circuits in the case of radio communication apparatuses. An example of such a radio receiver circuit is briefly described below with reference to FIG. 3. FIG. 3 is a simplified block diagram of a radio receiver circuit 10 according to an embodiment of the present invention. In FIG. 3, the radio receiver circuit 10 is connected to an antenna 15 for receiving electromagnetic radio frequency (RF) signals. Although a single antenna 15 is shown in FIG. 3, multiple antennas may well be used in other embodiments. In the embodiment illustrated in FIG. 3, the radio receiver circuit comprises RF processing circuitry 20 for operative connection to the antenna 15. The RF processing circuitry 20 is adapted to perform (analog) signal processing on RF signals from the antenna 15. The RF processing circuitry 20 may comprise one or more filters and/or other circuitry for processing of RF signals. Such circuitry is, per se, well known in the art of radio receivers and is therefore not further described herein in greater detail.

Furthermore, the embodiment of the radio receiver circuit 10 illustrated in FIG. 3 comprises a low-noise amplifier (LNA) circuit 30, having an input terminal 32 and an output terminal 34. Embodiments of the LNA circuit 30 are described in further detail below. The embodiment of the radio receiver circuit illustrated in FIG. 3 further comprises a termination circuit 40 having an input terminal 42 connected to the output terminal 34 of the LNA circuit 30. The term "termination circuit" in this context refers to any circuit that is connected to the output terminal 34 of the LNA circuit 30, and thus acts as a termination for the LNA circuit 30.

As indicated above, embodiments of the LNA circuit 30 may be employed in other types of receiver circuits than radio receiver circuits, e.g. receiver circuits for wireline communication apparatuses. In that case, instead of the antenna, such a receiver circuit may be connected to a connector for connection with a wireline communication network. The basic structure indicated in FIG. 3, with analog processing circuitry 20, an LNA circuit 30, and a termination circuit 40 may be used in such a (non-radio) receiver circuit as well.

Figure 1:
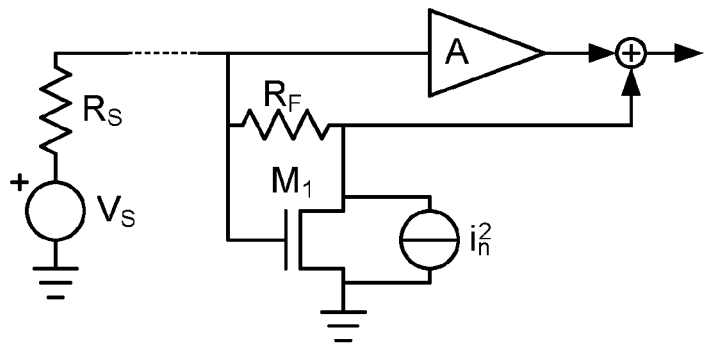
FIG. 1 illustrates a resistive shunt feedback noise cancellation low-noise amplifier.

Before describing embodiments of the LNA circuit 30 in more detail, a description of the inventors' further analysis of the circuit in FIG. 1 is provided to facilitate the understanding of the embodiments of the present invention. In the following, ω denotes angular frequency and s=jω, where j is the imaginary unit.

Assuming, without loss of generality and with reference to FIG. 1, that the input impedance of the amplifier A is high and the loading of the drain node of the MOS transistor M1 can be neglected. The LNA input impedance to is approximately given by $$Z_{in} \approx \frac{1}{g_m} \quad \text{(Eq. 1)}$$

where $g_m$ is the transconductance of the transistor M1. For impedance matching, $Z_{in}$ is typically is set to equal the source impedance $R_S$ (which is assumed to be the case in the following analysis). It can also be shown that the noise contribution from the MOS transistor M1 via its drain noise $i_n^2$ can be canceled at the LNA output when $$A = -\left(1 + \frac{R_F}{R_S}\right) \quad \text{(Eq. 2)}$$

(which is assumed to be the case in the following analysis). The noise canceling LNA of FIG. 1 provides a wide-band input match via the resistive shunt feedback around the MOS transistor M1 while its contribution to the over-all LNA noise is canceled. The remaining noise sources will be those of the amplifier A, which can now be designed more freely as long as the magnitude of the input impedance of the amplifier A is much larger than $R_S$, and contributions from $R_F$ (and other second-order parasitics left out of the discussion for clarity).

Taking into account the gain $A_F$ of the circuitry built around the MOS transistor M1, the overall signal gain $A_{LNA}$ of the LNA of FIG. 1 is given by $$A_{LNA} = A + A_F = -\left(1 + \frac{R_F}{R_S}\right) + (1 - g_m R_F) = -2\frac{R_F}{R_S} \quad \text{Eq. 3}$$

In order to limit the noise contributions from $R_F$, and to have a reasonable LNA gain, RF should be selected much larger than $R_S$.

Considering for a moment the resistive shunt feedback circuit (i.e. transistor M1 together with resistor $R_F$), which is part of the circuitry in FIG. 1. A drawback with this resistive shunt feedback circuit is that it requires a relatively high voltage gain, or $R_F$ will degrade the noise figure (NF). The drain noise $i_n^2$ of the transistor M1 will also be fed back to the input and add noise. As a rough approximation, we can say that the noise degradation (i.e. increase) due to $R_F$ and $i_n^2$ is $$\Delta NF = 10\log_{10}\left(1 + \frac{\gamma}{g_m R_{in}}\left(\frac{A_F}{2 + A_F}\right)^2 + \frac{1}{1 + A_F}\right) \quad \text{Eq. 4}$$

where γ is ½ for a bipolar junction transistor (BJT) (i.e. if M1 were replaced with a bipolar junction transistor) and ⅔ for a MOS transistor. Eq. 4 evaluates to some 0.65 dB for a BJT running at 5 mA with the input resistance $R_{in}$ at 50Ω and $A_F$=10. For a MOS transistor under the same conditions, the corresponding degradation of the NF would be around 0.9 dB (or would require about twice the current to get a similar ΔNF as for the BJT).

Considering again the whole circuit in FIG. 1, the noise that is canceled by the resistive shunt-feedback noise-canceling structure of FIG. 1 is the contribution from $i_n^2$, i.e. the term $$\frac{\gamma}{g_m R_{in}}\left(\frac{A_F}{2 + A_F}\right)^2 \quad \text{Eq. 5}$$

However, the contribution from $R_F$, represented in Eq. 4 with the term $$\frac{1}{1 + A_F} \quad \text{Eq. 6}$$

still remains and still require a relatively high voltage gain.

The high LNA voltage gain that is required for low noise will at the same time reduce linearity as clipping at the drain node of M1 is at a fixed level and the corresponding input compression point will, thus, be inversely proportional to the LNA gain. For example, assuming clipping at the LNA output occurs at 1V amplitude, then with A=10 we get an input compression point in 50Ω around −10 dBm. A one volt amplitude corresponds almost to a rail-to-rail swing for a typical bipolar transistor, while it is almost twice the supply voltage of MOS devices. Thus, this is already higher than what is practical and cannot easily be increased; the gain has to be limited for reasonable linearity. That is, there is a built-in conflict between linearity and noise figure for the resistive shunt feedback and noise canceling LNA of FIG. 1.

Figure 4:
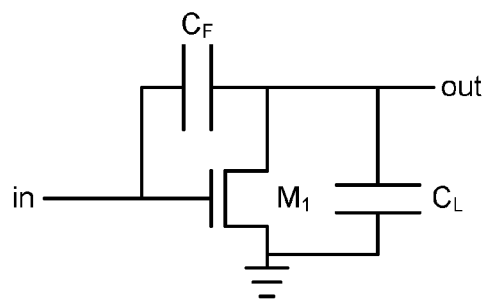
FIG. 4 illustrates a conventional capacitive shunt feedback amplifier.

The inventors have realized that this problem can be alleviated using a capacitive shunt feedback instead of a resistive shunt feedback, whereby a structure that does not rely on high voltage gain for low noise is obtained, since the feedback component is reactive and, thus, (ideally) noiseless. The reactive feedback impedance is converted to a resistive input impedance by means of a frequency dependent voltage gain proportional to 1/ω. To further facilitate the understanding of embodiments of the present invention, a simplified schematic circuit diagram of a conventional capacitive shunt feedback LNA is illustrated in FIG. 4 for reference. This circuit converts the capacitive feedback impedance to a resistive input impedance by means of a frequency dependent (∝1/ω) voltage gain. The input impedance of the circuit in FIG. 4 is approximately $$Z_{in}(s) \approx \frac{\frac{1}{g_m}\left(1 + \frac{C_L}{C_F}\right)}{1 + s\frac{C_{gs}}{g_m}\left(1 + \frac{C_L}{C_F}\right)} \quad \text{Eq. 7}$$

where $g_m$ is the transconductance of the transistor M1 in FIG. 4. The input impedance has a low-pass characteristic with a resistive part approximately equal to $(1+C_L/C_F)/g_m$ and a bandwidth approximately equal to $\omega_T/(1+C_L/C_F)$, where $\omega_T$ denotes the angular transit frequency of the transistor which typically is much larger than the operating frequency.

The voltage gain $A_v$ of the circuit in FIG. 4 is frequency dependent with a low-pass character $$A_v \approx \frac{sC_F - g_m}{sC_F + sC_L} \approx -\frac{g_m}{sC_F + sC_L} \quad \text{Eq. 8}$$

The approximations in Eq. 8 are valid for typical component values and typical frequencies of interest achievable and used in integrated circuit LNAs. So, in spite giving a wide-band resistive input impedance (see Eq. 7) the gain does not have a very wide bandwidth, which limits the usable frequency range. In accordance with embodiments of the present invention, this limitation is alleviated by means of the concept of using the current through $C_L$ as the output rather than the voltage across it. This can be accomplished by terminating the ground end of $C_L$ in a low impedance node, such that the current through $C_L$ is essentially independent of this termination, yielding a transconductance $$G \approx A_v s C_L \approx \frac{sC_F - g_m}{sC_F + sC_L} sC_L \approx -\frac{g_m C_L}{C_F + C_L} \quad \text{Eq. 9}$$

This is an approximately frequency independent transconductance when $\omega \ll g_m/C_F$.

Figure 5:
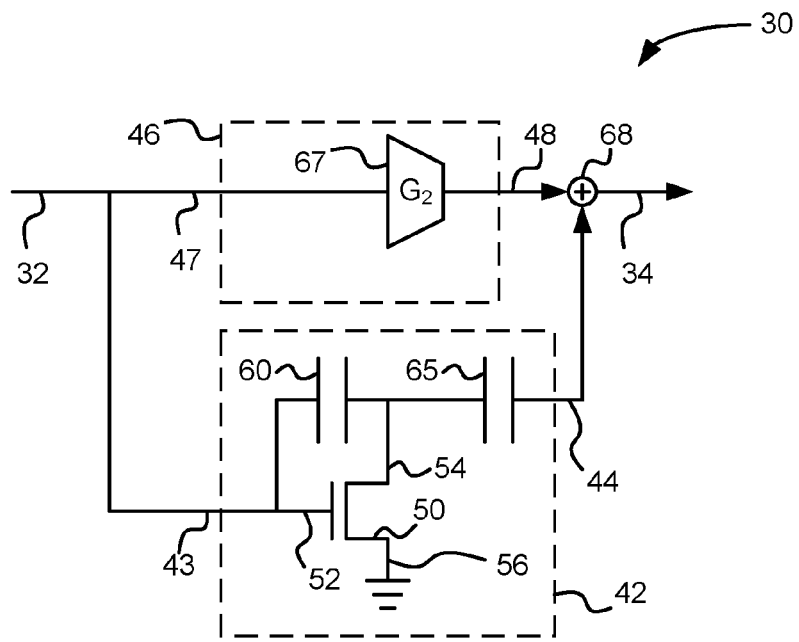
FIG. 5 is a simplified schematic circuit diagram of a low-noise amplifier according to some embodiments of the present invention.

FIG. 5 is a simplified schematic circuit diagram of the LNA circuit 30 according to embodiments of the present invention. The LNA circuit 30 is capable of amplifying signals at an operating frequency f (corresponding to an angular frequency ω=2πf), or a continuous band of such operating frequencies. In some embodiments, the operating frequency f (or continuous band) is a fixed predetermined frequency (or continuous band). In other embodiments, the LNA circuit is tunable to several such operating frequencies f (or continuous bands). The LNA circuit 30 comprises a first amplifier branch 42 having an input terminal 43 connected to input terminal 32 of the LNA circuit 30. The LNA circuit 30 further comprises a second amplifier branch 46 having an input terminal 47 connected to the input terminal 32 of the LNA circuit 30. According to embodiments of the present invention, the first amplifier branch 42 comprises an output terminal 44 for supplying an output current of the first amplifier branch 42. Furthermore, according to embodiments of the present invention, the first amplifier branch comprises a common source or common emitter amplifier, in the following referred to as a main amplifier, having a capacitive shunt feedback. The main amplifier comprises an input transistor 50 having a first terminal 52, which is a gate or base terminal, operatively connected to the input terminal 43 of the first amplifier branch. In FIG. 5, the input transistor 50 is a MOS transistor, whereby the main amplifier is a common source amplifier and the first terminal 52 is a gate terminal. However, in other embodiments, the input transistor may well be some other kind of transistor, e.g. a BJT, which is further described below in the context of FIG. 8. The input transistor 50 of the main amplifier is arranged to, in operation, be biased to have a transconductance $g_m$ at the operating frequency f.

Moreover, according to embodiments of the present invention, the main amplifier comprises a shunt-feedback capacitor 60 operatively connected between the first terminal 52 of the input transistor 50 and a second terminal 54, which is a drain or collector terminal, of the input transistor 50. Again, in FIG. 5, the input transistor 50 is a MOS transistor, so the second terminal 54 is consequently a drain terminal. According to embodiments of the present invention, the main amplifier further comprises an output capacitor 65 operatively connected between the second terminal 54 of the input transistor 50 and the output terminal 44 of the first amplifier branch 42. Using a consistent notation with FIG. 4, the capacitance of the shunt-feedback capacitor 60 is in the following denoted $C_F$, and the capacitance of the output capacitor 65 is in the following denoted $C_L$. Although the shunt-feedback capacitor 60 is shown in the figures as an individual component, separate from the input transistor 50, it should be noted that the parasitic gate-to-drain capacitance of the input transistor 50 may provide a not negligible contribution to the capacitance $C_F$. Thus, the shunt-feedback capacitor 60 may in many cases be seen as comprising the gate-to-drain capacitance of the input transistor 50 as well as a dedicated capacitor in parallel therewith. In extreme cases, the shunt-feedback capacitor 60 may even be built up by (or, simply phrased, "be") the gate-to-drain capacitance of the input transistor 50 alone.

In embodiments of the present invention, the second amplifier branch 46 comprises an output terminal 48 for supplying an output current of the second amplifier branch 46. As illustrated in FIG. 5, the second amplifier branch 46 may comprise a transconductor 67 arranged to generate the output current of the second amplifier branch 46. In FIG. 5, $G_2$ denotes the transconductance of transconductor 46.

Furthermore, according to embodiments of the present invention, the LNA circuit 30 comprises circuitry 68 for combining the output current of the first amplifier branch 42 and the output current of the second amplifier branch 46, thereby generating a total output current of the LNA circuit 30. In some embodiments, the circuitry 68 may simply be an interconnection of the terminals 44 and 48. However, in some embodiments, more elaborate structures may be used for combining the output currents of the first amplifier branch 42 and the second amplifier branch 46. As a non-limiting example, a common-gate amplifier configuration (not shown) may be used for that purpose in the circuitry 68. The output terminal 44 of the first amplifier branch may be connected to an input terminal (i.e. source terminal) of a MOS transistor in common-gate configuration, whereas the output terminal 48 of the second amplifier branch 46 may be connected to an output terminal (i.e. drain terminal) of the MOS transistor in common gate configuration, where the currents are added (a similar constitution of the circuitry 68 using a BJT in common base configuration may be used as well, just replace MOS transistor, common gate, source, and drain with the terms BJT, common base, emitter, and collector, respectively, in the preceding description). Such a configuration provides the desired low-impedance termination of the output capacitor 65. More generally, the desired low-impedance termination of the output capacitor 65 may be provided by the circuitry 68. In alternative embodiments, such a low-impedance termination may instead be accomplished via the termination circuit 40 (FIG. 3), as further discussed below with reference to FIG. 10.

By combining the output currents of the first amplifier branch 42 and the second amplifier branch 46, the intrinsic drain noise of the input transistor 50 of the main amplifier can be cancelled much like in the noise canceling LNA in FIG. 1, but without the problem with the noise degradation due to $R_F$ (FIG. 1) described above. An approximate condition for when the intrinsic drain noise of the input transistor 50 of the main amplifier is canceled at the output of the circuitry 68 is given by $$\frac{y_L + R_S y_F (y_L - G_2)}{y_F + y_L + R_S y_F (y_L + G_2)} = 0 \quad \text{Eq. 10}$$

or $$G_2 = y_L \left(1 + \frac{1}{R_S y_F}\right) = \frac{y_L}{R_S y_F}(1 + R_S y_F) \quad \text{Eq. 11}$$

where $y_L = j2\pi f C_L$ and $y_F = j2\pi f C_F$ denote the admittances of the output capacitor 65 and the shunt-feedback capacitor 60, respectively, and it is assumed that the input impedance of the first amplifier branch 42 has been matched with the source resistance R. $G_2$ according to Eq. 11 is conductive for $f < 1/(2\pi C_F R_S)$, which covers many practical cases. If a small resistor is added in series with the output capacitor 65, a broader cancellation bandwidth can be realized at a relatively small noise penalty. In fact, the input of the circuitry 68 that is connected to the output capacitor (i.e. connected to the output terminal 44 of the first amplifier branch 42) should ideally be a signal ground, but it will in practice be a node with nonzero finite impedance, and this can be tuned to maximize the cancellation bandwidth. Of course the above analysis is simplified, but those skilled in the art will understand how to make straight forward compensations for well known parasitic effects not mentioned here, e.g. using computer simulations based on detailed transistor models.

Figure 6:
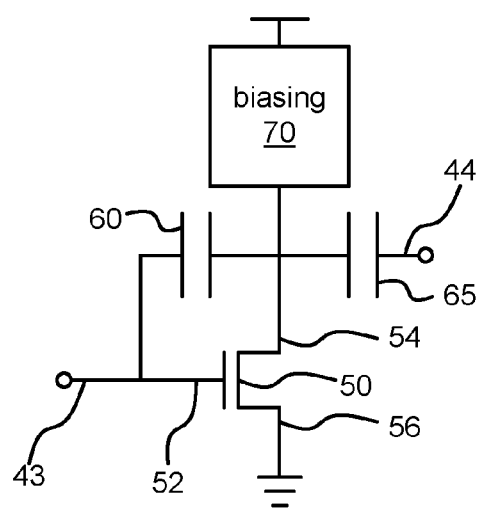
FIGS. 6-9 are simplified schematic circuit diagrams of part of a low-noise amplifier circuit according to some embodiments of the present invention.
Figure 7:
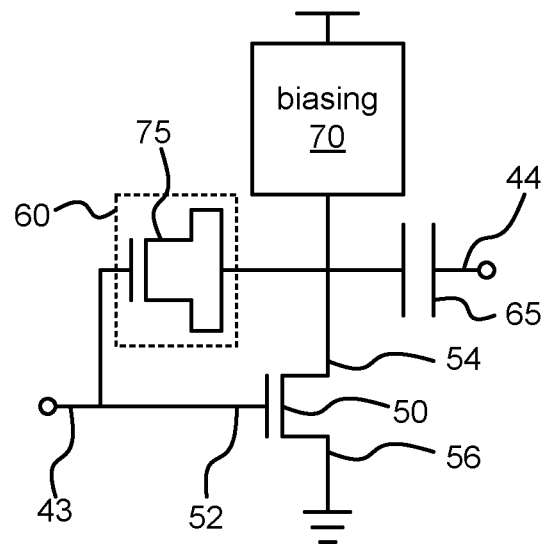

Simplified schematic circuit diagrams of said main amplifier (comprised in the first amplifier branch 42) according to embodiments of the present invention, are provided in FIGS. 6-9. FIG. 6 illustrates an embodiment of the main amplifier, much similar to that included in FIG. 5, wherein the input transistor 50 is a MOS transistor, and the main amplifier is a common source amplifier. In FIG. 6, a biasing unit 70 adapted to bias the LNA circuit 30 at a suitable operating point is included. The biasing unit 70 may be comprised in the main amplifier, or may be external to the main amplifier. Alternatively, part of the biasing circuit 70 may be comprised in the main amplifier while the remainder of the biasing circuit 70 may be external to the main amplifier. The biasing unit 70 may e.g. comprise a passive network and/or an active network arranged to provide a suitable DC biasing current for the input transistor 50. Typically, the biasing unit 70 would be designed such as to provide an open circuit at the operating frequency f (or the continuous band of such operating frequencies). The biasing unit 70 is included also in the embodiments illustrated in FIGS. 7-9. The design of a suitable biasing unit 70 for a particular embodiment would be a straightforward task for a person skilled in amplifier design and is therefore not further described herein in any greater detail.

According to some embodiments, the transconducatance $g_m$ is made larger (in some embodiments much larger) than $1/R_s$. Thus, the shunt-feedback capacitance $C_F$, can be made relatively small (i.e. with small capacitance, which also translates to a small area) and typically smaller, normally much smaller, than the capacitance $C_L$ of the output capacitor 65. Furthermore, the loop feedback factor, or return ratio, can be made relatively small. This implies that the gain reduction due to $C_F$ is typically relatively small.

As hinted above, depending on chosen design parameters of the input transistor 50 and the capacitance $C_L$ of the output capacitor 65, the aforementioned gate-to-drain capacitance (or "internal shunt feedback capacitance") of the input transistor 50 may provide a significant contribution to $C_F$. Consequently, a relatively small additional area may be needed for the shunt-feedback capacitor 60 in order to reach the value of $C_F$ that is needed to reach the desired input resistance.

In an integrated environment, the transistors and capacitors may be made in the same technology and $g_m$, $C_F$, and $C_L$ are correlated resulting in tight tolerances. If the shunt-feedback capacitor 60 (or the part of the shunt feed-back capacitor 60 that is not the gate-to-drain capacitance of the input transistor 50) is built from a MOS gate capacitor, the matching condition will only depend on a capacitance ratio (i.e. layout feature sizes) and the transconductance $g_m$ of the input transistor 50. In practice this reduces the design work to control $g_m$ of the input transistor 50 and to make sure that parasitics are included reasonably well in the modeling of $C_F$ and $C_L$, and thus provides a relatively low design complexity, which is advantageous. Accordingly, in some embodiments of the present invention, wherein the input transistor 50 is a MOS transistor the shunt-feedback capacitor 60 is, or comprises, a MOS gate capacitor implemented with a MOS transistor of the same type as the input transistor 50. This is illustrated with an example in FIG. 7, where the shunt-feedback capacitor of the embodiment in FIG. 6 has been implemented with a MOS transistor 75.

Figure 8:
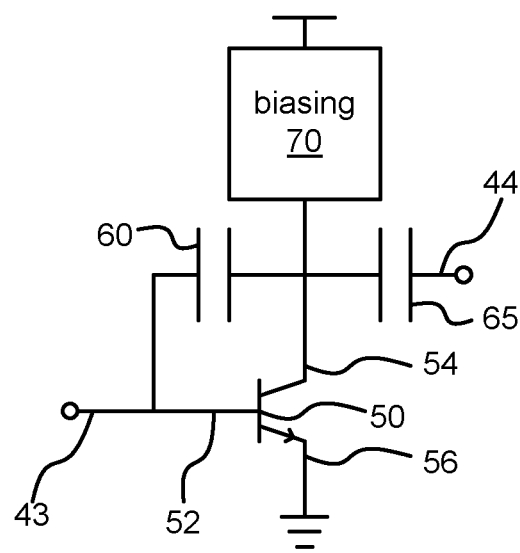

As mentioned above, other types of transistors than MOS transistors may be used for the input transistor 50 of the main amplifier. This is illustrated in FIG. 8, showing an embodiment of the main amplifier wherein the input transistor 50 is a bipolar junction transistor (BJT) in common-emitter configuration.

Figure 9:
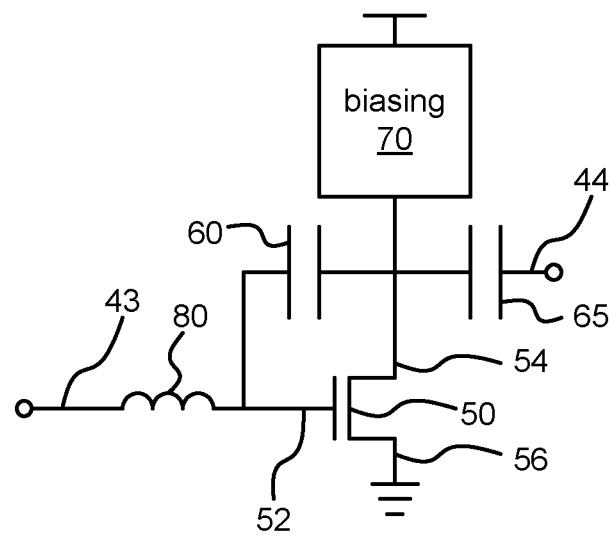

If needed, a relatively small series inductor can be used to broaden the bandwidth by making the low-pass characteristic of the input impedance (of the main amplifier) a second order, instead of a first order low-pass characteristic, which is the case without such an inductor (see e.g. Eq. 7). Such an inductor would still make the structure low-pass, and hence not operating frequency dependent, and can thus, be integrated or be part of the package or PCB. Therefore, according to some embodiments, the main amplifier comprises a series inductor operatively connected between the first terminal 52 (i.e. gate or base) of the input transistor 50 and the input terminal 43 of the first amplifier branch 42. This is illustrated in FIG. 9 with an example embodiment where a series inductor 80 has been added (connected between the first terminal 52 of the input transistor 50 and the input terminal 43 of the first amplifier branch) to the embodiment illustrated in FIG. 6.

In some embodiments of the present invention, the output capacitor 65 is made relatively small. This is in contrast with so called DC blocking capacitors, for which the capacitance is normally selected relatively large to effectively block the DC-level from propagating and provide essentially a short circuit at the frequency of interest. More specifically, according embodiments of the present invention, the output capacitor 65 has a capacitance value $C_L < g_m/f$, which is significantly lower than what would be used for a DC-blocking capacitor. With this choice of capacitor value there will be some residual signal voltage across the capacitor 65 which acts like a frequency dependent voltage-to-current converter. This converter action in combination with the frequency dependent voltage gain at the node 54 provides a frequency independent gain (i.e. transconductance) from the main amplifier input to load capacitor current. When this gain is frequency independent a wideband operation is facilitated.

As mentioned above in the context of FIG. 3, the LNA circuit 30 may be comprised in a radio receiver circuit 10, together with a termination circuit 40. According to some embodiments of the present invention, the input terminal 42 of the termination circuit 40, which is connected to the output terminal 34 of the LNA circuit 30, is a current input terminal, i.e. a terminal that is specifically designed (or "particularly well suited") to receive an electrical current as input, thereby providing a desired low-impedance termination of the output capacitor 65 of the main amplifier. This property may e.g. be defined, or quantified, in terms of input impedance or scattering parameters. For example, according to some embodiments, the magnitude $|Z_{in}(f)|$ of the input impedance $Z_{in}$ of the termination circuit 40 at the frequency f is less than 1/10 of the magnitude $|Z_{C_L}(f)|=1/(2\pi f \cdot C_L)$ of the impedance $Z_{C_L}(f)$ of the output capacitor 65 of the main amplifier of the first amplifier branch 42 of the LNA circuit 30. (Note that $Z_{in}$ in the preceding sentence is used to denote the input impedance of the termination circuit 40, whereas in Eq. 7, it is used to denote the input impedance of the circuit in FIG. 4. Having emphasized that, there should be no risk for confusion.) The ratio 1/10 is only an example; other numbers may be used as well depending on application. A suitable ratio for a given application, with given performance requirements on the LNA circuit 30, may e.g. be determined using computer simulations. The ratio 1/10 may be a suitable starting point for such simulations.

The input impedance of the termination circuit 40 in turn affects the s11 scattering parameter of the LNA circuit 30, which thus in turn can be used to characterize the suitability of the termination circuit for receiving an electrical current as an input signal. For example, according to some embodiments the magnitude $|s_{11}(f)|$ of the scattering parameter $s_{11}$ at the input terminal 32 of the LNA circuit 30 is less than −10 dB at the frequency f. The s11 parameter value −10 dB is only an example; other numbers may be used as well depending on application. A suitable s11 parameter value for a given application, with given performance requirements on the LNA circuit 30, may e.g. be determined using computer simulations. The s11 parameter value −10 dB may be a suitable starting point for such simulations.

Figure 10:
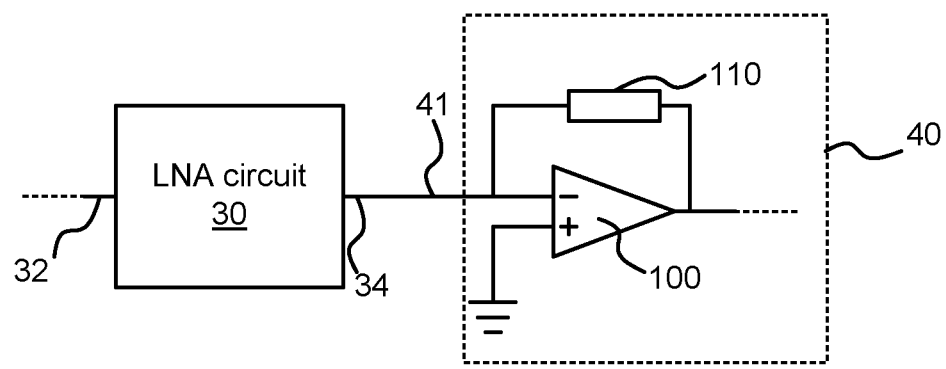
FIGS. 10-11 illustrate part of a radio receiver circuit according to an embodiment of the present invention.
Figure 11:
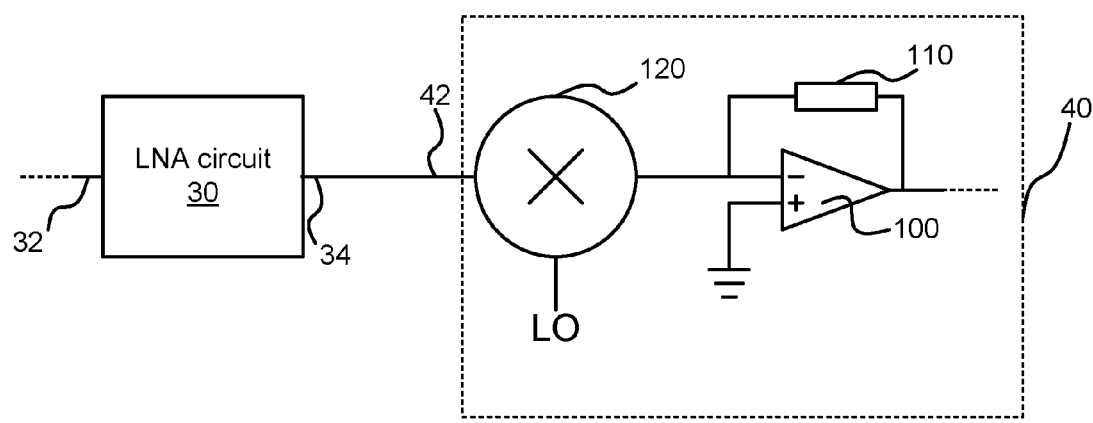

FIG. 10 illustrates with an example how a termination circuit 40 with such a current input terminal may be accomplished. In FIG. 10, the termination circuit 40 comprises a feedback-connected operational amplifier 100. In FIG. 10, the negative feedback of the operational amplifier 100 provides a virtual ground node at the negative input terminal of the operational amplifier 100. Qualitatively speaking, varying the current input to the input terminal 42 would only result in a relatively small voltage variation (ideally none for an operational amplifier with infinite gain) at the input terminal 42, whereby the input terminal 42 is suitable for receiving an input current. In FIG. 10, the virtual-ground node of the feed-back connected operational amplifier 100 is used as current input terminal. The example illustrated in FIG. 10 is only an example. Another example of a circuits that can be designed to have a suitable input impedance value, or provide a suitable s11 value for the LNA circuit 30, to be suitable for receiving an electrical current as input signal is a current-mode mixers. This is illustrated in FIG. 11, showing a mixer 120, driven by a local oscillator signal "LO", connected in the path between the LNA circuit and feedback-connected operational amplifier 100. Other examples of circuits that can be designed to have a suitable input impedance value, or provide a suitable s11 value for the LNA circuit 30, to be suitable for receiving an electrical current as input signal are e.g. common-base amplifiers, common-gate amplifiers, trans-impedance amplifiers, and transformers. Thus according to some embodiments of the present invention, the termination circuit 40 is or comprises a common-base amplifier, a common-gate amplifier, a trans-impedance amplifier, a feedback-connected operational amplifier 100 with a virtual-ground node as current input terminal, a transformer, or a current-mode mixer.

The present invention has been described above with reference to specific embodiments. However, other embodiments than the above described are possible within the scope of the invention. The different features of the embodiments may be combined in other combinations than those described. For example, even though the series inductor 80 (FIG. 9) and MOS gate capacitor 75 (FIG. 7) have been shown together with a MOS transistor as the input transistor 50, they may well be used together with a BJT as input transistor 50 as well. Furthermore, even though the series inductor 80 (FIG. 9) and MOS gate capacitor 75 (FIG. 7) have been shown in separate embodiments, they may of course be used together in other embodiments. Moreover, for simplicity of illustration, the main amplifier of the first amplifier branch 42 of the LNA circuit 30 has been illustrated in FIGS. 6-9 with single-ended embodiments. However, these embodiments can be extended to differential embodiments in a straightforward manner for a person skilled in LNA design, for example by combining two such single-ended main amplifier circuits. Similarly, a differential design may then be used for the second amplifier branch 46, e.g. using a differential transconductor as the transconductor 67. The use of single-ended embodiments for illustration in this detailed description is thus not intended as limiting for the scope, and it should be noted in this context that a differential amplifier can be considered as comprising a single-ended amplifier as a sub component. Furthermore, in the figures, shunt-feedback capacitor 60 and output capacitor 65 have been shown as directly connected to the second terminal of the input transistor 50. However, in some embodiments, there may well be some intervening or isolating components connected in between second terminal of the input transistor and either or both of the shunt-feedback capacitor 60 and the output capacitor, such as one or more cascode transistors, buffer transistors, and/or buffer amplifiers. The scope of the invention is only limited by the appended patent claims.

The invention claimed is:

1. A receiver circuit comprising:
a low-noise amplifier (LNA) circuit for amplifying signals at an operating frequency f; and
a termination circuit with a current input terminal connected to the output terminal of the LNA circuit,
wherein the LNA comprises:
a first and a second amplifier branch, each having an input terminal connected to an input terminal of the LNA circuit, wherein
the first amplifier branch comprises:
    an output terminal for supplying an output current of the first amplifier branch; and
    a common source or common emitter amplifier, in the following referred to as a main amplifier, having
        an input transistor having a first terminal, which is a gate or base terminal, operatively connected to the input terminal of the first amplifier branch;
        a shunt-feedback capacitor operatively connected between the first terminal of the input transistor and a second terminal, which is a drain or collector terminal, of the input transistor; and
        an output capacitor operatively connected between the second terminal of the input transistor and the output terminal of the first amplifier branch; and
the second amplifier branch comprises:
    an output terminal for supplying an output current of the second amplifier branch; and
the LNA circuit comprises circuitry for combining the output current of the first amplifier branch and the output current of the second amplifier branch, thereby generating a total output current of the LNA circuit, and
wherein the termination circuit is or comprises a common-base amplifier, a common-gate amplifier, a trans-impedance amplifier, a feedback-connected operational amplifier with a virtual-ground node as current input terminal, a transformer, or a current-mode mixer.

2. The receiver circuit according to claim 1, wherein the input transistor of the main amplifier is arranged to, in operation, be biased to have a transconductance $g_m$ at the operating frequency f and the output capacitor has a capacitance value $C_L < g_m/f$.

3. The receiver circuit according to claim 1, wherein the input transistor of the main amplifier is a MOS transistor in common-source configuration, the first terminal of said input transistor is a gate terminal, the second terminal of said input transistor is a drain terminal, and the main amplifier is a common source amplifier.

4. The receiver circuit according to claim 3, wherein the shunt-feedback capacitor is or comprises a MOS gate capacitor implemented with a MOS transistor of the same type as the input transistor of the main amplifier.

5. The receiver circuit according to claim 3, wherein the feedback capacitor is or comprises a gate-to-drain capacitance of the input transistor of the main amplifier of the first amplifier branch.

6. The receiver circuit according to claim 1, wherein the input transistor of the main amplifier is a bipolar junction transistor in common-emitter configuration, the first terminal of said input transistor is a base terminal, the second terminal of said input transistor is a collector terminal.

7. The receiver circuit according to claim 1, wherein the second amplifier branch comprises a transconductor arranged to generate the output current of the second amplifier branch.

8. The receiver circuit according to claim 1, wherein the main amplifier further comprises a series inductor operatively connected between the first terminal of the input transistor and the input terminal of the main amplifier branch.

9. The receiver circuit according to claim 1, wherein the receiver circuit is a radio receiver circuit.

10. A radio communication apparatus comprising the receiver circuit according to claim 9.

11. The radio communication apparatus according to claim 10, wherein the radio communication apparatus is a mobile terminal or a wireless data modem.

12. The radio communication apparatus according to claim 10, wherein the radio communication apparatus is a radio base station.

13. A wireline communication apparatus comprising the receiver circuit according to claim 1.

14. The wireline communication apparatus according to claim 13, wherein the wireline communication apparatus is a cable modem.

* * * * *